(12) United States Patent
Cosand (10) Patent No.: US 10,063,254 B1
(45) Date of Patent: Aug. 28, 2018

(54) DELTA SIGMA MODULATOR

(71) Applicant: HRL Laboratories, LLC, Malibu, CA (US)

(72) Inventor: Albert E. Cosand, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/809,974

(22) Filed: Nov. 10, 2017

Related U.S. Application Data

(62) Division of application No. 15/603,399, filed on May 23, 2017, now abandoned.

(51) Int. Cl.
*H03M 3/00* (2006.01)

(52) U.S. Cl.
CPC ................... *H03M 3/464* (2013.01)

(58) Field of Classification Search
CPC .......... H03M 3/464; H03M 3/00; H03M 1/66; H03M 1/747
USPC ................ 341/143, 161, 172, 118
See application file for complete search history.

(56) References Cited

U.S. PATENT DOCUMENTS

| | | | |
|---|---|---|---|
| 4,471,341 A | 9/1984 | Sauer | |
| 5,012,247 A | 4/1991 | Dillman | |
| 6,323,801 B1 | 11/2001 | McCartney et al. | |
| 7,679,540 B2 * | 3/2010 | Ceballos | H03M 3/342 341/118 |
| 8,368,573 B2 * | 2/2013 | Kanayama | H03M 3/35 341/143 |
| 8,493,256 B2 * | 7/2013 | Knudsen | H03M 3/43 341/143 |
| 9,307,173 B2 | 4/2016 | Takamiya et al. | |
| 2005/0270202 A1 * | 12/2005 | Haartsen | H03M 1/04 341/143 |
| 2011/0074614 A1 * | 3/2011 | Ogawa | H02M 3/07 341/143 |
| 2012/0007760 A1 * | 1/2012 | Knudsen | H03M 3/43 341/143 |

(Continued)

OTHER PUBLICATIONS

"Design Approaches for Digitally Dominated Active Pixel Sensors: Leveraging Moore's Law Scaling in Focal Plane Readout Design", Tyrrell et al., Proceedings of SPIE vol. 6900, 2008.

(Continued)

*Primary Examiner* — Jean B Jeanglaude
(74) *Attorney, Agent, or Firm* — Ladas & Parry (57) ABSTRACT

A delta sigma modulator having:
an integrator that receives an input signal;
a comparator that outputs a digital pulse when an output of the integrator goes beyond a threshold;
a 1 bit DAC that outputs a predetermined analog signal in response to the digital pulse; and
a subtractor that subtracts the analog signal from the input signal;
wherein the 1-bit DAC comprises: an output MOS transistor having its gate and drain connected by default to a predetermined control voltage and to a current sink;
wherein in response to the digital pulse a control circuit controllably brings the MOS transistor to a non-conductive state where any drop in voltage of its source causes the MOS transistor to conduct and, after connecting the drain of the MOS transistor away from the current sink and to an output node, pulls down the source until a predetermined charge is sent to the output node.

8 Claims, 6 Drawing Sheets

(56) References Cited

U.S. PATENT DOCUMENTS

2015/0171887 A1* 6/2015 Okuda ................. H03M 3/372
　　　　　　　　　　　　　　　　　　　　　　341/143

OTHER PUBLICATIONS

"Flexible Readout and Integration Sensor (FRIS): A Bio-Inspired, System-On-Chip, Event-Based Readout Architecture", Lin et al., Proceedings of SPIE vol. 8353, 2012.
From U.S. Appl. No. 15/603,399, filed May 23, 2017, unpublished non publication request filed, Notice of Allowance dated Jan. 18, 2018.
From U.S. Appl. No. 15/603,399, filed May 23, 2017, unpublished non publication request filed, Office Action dated Oct. 19, 2017.
From U.S. Appl. No. 15/603,399, filed May 23, 2017, unpublished non publication request filed, Office Action dated Sep. 12, 2017.
U.S. Appl. No. 15,603,399, filed May 23, 2017, Cosand.

* cited by examiner

FIG. 8

DELTA SIGMA MODULATOR

CROSS REFERENCE TO RELATED APPLICATION

This application claims the benefit of and is a divisional of U.S. patent application Ser. No. 15/603,399 filed on May 23, 2017, the disclosure of which is incorporated herein by reference.

TECHNICAL FIELD

This presentation is directed in general to the area of charge transfer circuits.

BACKGROUND OF THE DISCLOSURE

Charge transfer circuits can be used to actuate electromagnetic actuators or in the area of sensor readouts or for any general charge nulling application. For example in the area of sensor readouts, a photosensitive diode can charge a capacitor and, in order to know how much light was received by the diode it can be desired to measure the charge of the capacitor by counting how many transfers of a predetermined charge are necessary to empty the capacitor.

Sensor readout schemes such as described in "*Design Approaches for Digitally Dominated Active Pixel Sensors: Leveraging Moore's Law Scaling in Focal Plane Readout Design*" by Tyrrell, et al, in Proc. Of SPIE Vol. 6900, (2008) use charge transfer or charge subtracting circuits.

Other sensor readout schemes, such as described in "*Flexible Readout and Integration Sensor (FRIS): A Bio-Inspired, System-On-Chip, Event-Based Readout Architecture*" by Lin, et al in Proc. of SPIE Vol. 8353, (2012) use a Sigma-Delta ADC that requires a 1-bit DAC, where a switched capacitor 1-bit DAC can be described as a charge transfer circuit.

Figure 1:
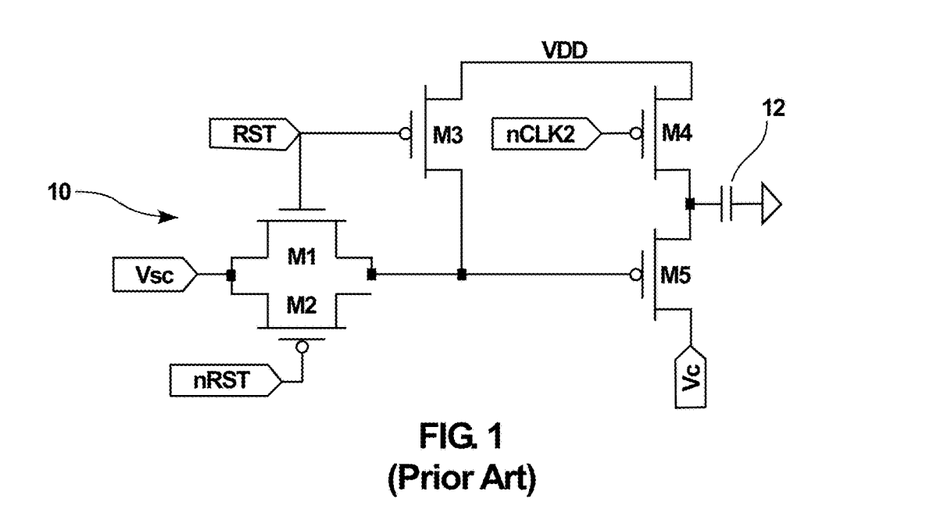
FIG. 1 illustrates a known switched-capacitor 1-bit DAC.

FIG. 1 illustrates a known switched capacitor 1-bit DAC 10 having a capacitor 12 that outputs a transferred charge of: $Qsc=C \times (VDD-V_{THP}-V_{sc})$. It is noted that the transferred charge depends on the threshold voltage $V_{THP}$ of the output transistor M5, where such threshold voltage varies with flicker and RTS noise. As the size of the sensor array grows, the size of the transistors decreases and the effects of flicker and random noise makes difficult to pick signals of interest.

Next generation imagers, such as infrared imagers, may require high resolution digital read-out circuits to achieve the required fidelity in imaging. The precision and sensitivity of sensor readouts depend greatly on minimizing the effect of noise on the charge that is effectively transferred by any charge transfer circuit used for the sensor readout. The inventor has noted that the charge that is effectively transferred by known charge transfer circuits suffers from errors caused by flicker noise or random telegraph noise, in particular when the charge transfer circuit is a MOS circuit.

There exists a need for a charge transfer circuit that can transfer a precise charge without being sensitive to flicker and RTS noise.

SUMMARY OF THE DISCLOSURE

To address one or more of the above-deficiencies of the prior art, several embodiments described in this presentation provide for an auto-zeroing technique and a unique preset procedure on a continuous basis to automatically eliminate errors due to flicker noise and RTS noise.

An embodiment of this presentation relates to a charge transfer circuit arranged for coupling a source of an output MOS transistor to a charged capacitor; a drain of the output MOS transistor being coupled to a current drain node; and after a predetermined time, during which some current may flow through the output MOS transistor into the current drain node to pre-bias the gate-source voltage of the output MOS transistor, coupling the drain of the output MOS transistor away from the current drain node and to a current output node; and discharging the capacitor into the current output node through the output MOS transistor.

An embodiment of this presentation relates to an auto-zeroed charge transfer circuit comprising: an output MOS transistor having a gate, a source and a drain; the gate of the MOS transistor being maintained to a predetermined control voltage and the drain of the MOS transistor being connected by default to a current sink; and a control circuit arranged to, in response to an input signal, bring the MOS transistor to a non-conductive state where any drop in voltage of the MOS transistor source causes the MOS transistor to conduct and, after connecting the drain of the MOS transistor away from the current sink and to an output node, pull down the source of the MOS transistor until a predetermined charge is sent to the output node through the MOS transistor.

According to an embodiment of this presentation, the control circuit comprises: a capacitor having a first capacitor node controllably connectable to a first voltage supply node and a second capacitor node controllably switchable between a second voltage supply node and the first voltage supply node; the first capacitor node being coupled to the source of the MOS transistor; and a bypass circuit arranged for controllably switching the drain of the MOS transistor between said output node and said current sink node.

According to an embodiment of this presentation, the control circuit is arranged to, in response to said input signal: with the drain of the output MOS transistor switched to the current sink node, the first capacitor node connected to the first voltage supply node and the second capacitor node switched to the second voltage supply node, disconnect the first capacitor node from the first voltage supply node; and after a first predetermined time, switch the drain of the output MOS transistor to the output node and switch the second capacitor node to the first voltage supply node; and after a second predetermined time, switch the drain of the output MOS transistor to the current sink node, connect the first capacitor node to the first voltage supply node and switch the second capacitor node to the second voltage supply node.

According to an embodiment of this presentation, the control circuit comprises a multi-tap delay line.

According to an embodiment of this presentation, the auto-zeroed charge transfer circuit comprises a first charge MOS transistor for controllably connecting the first capacitor node to the first voltage supply node.

According to an embodiment of this presentation, the auto-zeroed charge transfer circuit comprises a second charge MOS transistor arranged between the second capacitor node and the first voltage supply node and a third charge MOS transistor arranged between the second capacitor node and the second voltage supply node for controllably switching the second capacitor node between the second voltage supply node and the first voltage supply node.

According to an embodiment of this presentation, the auto-zeroed charge transfer circuit comprises a first bypass MOS transistor arranged between the current sink node and the drain of the output MOS transistor, and a second bypass MOS transistor arranged between the output node and the drain of the output MOS transistor for controllably switching the drain of the output MOS transistor between the output node and the current sink node.

According to an embodiment of this presentation, the first capacitor node is coupled to the source of the output MOS transistor by an isolation switch; the control circuit being arranged to, in response to said input signal: with the drain of the output MOS transistor switched to the current sink node, the first capacitor node connected to the first voltage supply node and the second capacitor node switched to the second voltage supply node, disconnect the first capacitor node from the first voltage supply node and turn the isolation switch on; and after a first predetermined time, switch the drain of the output MOS transistor to the output node and switch the second capacitor node to the first voltage supply node; and after a second predetermined time, switch the drain of the output MOS transistor to the current sink node, turn the isolation switch off, connect the first capacitor node to the first voltage supply node and switch the second capacitor node to the second voltage supply node.

According to an embodiment of this presentation, the control circuit comprises a multi-tap delay line.

According to an embodiment of this presentation, the auto-zeroed charge transfer circuit comprises a first charge MOS transistor for controllably connecting the first capacitor node to the first voltage supply node.

According to an embodiment of this presentation, the auto-zeroed charge transfer circuit comprises a second charge MOS transistor arranged between the second capacitor node and the first voltage supply node and a third charge MOS transistor arranged between the second capacitor node and the second voltage supply node for controllably switching the second capacitor node between the second voltage supply node and the first voltage supply node.

According to an embodiment of this presentation, the auto-zeroed charge transfer circuit comprises a first bypass MOS transistor arranged between the current sink node and the drain of the output MOS transistor, and a second bypass MOS transistor arranged between the output node and the drain of the output MOS transistor for controllably switching the drain of the output MOS transistor between the output node and the current sink node.

An embodiment of this presentation relates to a delta sigma modulator comprising: an integrator arranged to integrate an input signal; a comparator arranged to output a predetermined digital pulse when an output of the integrator goes beyond a predetermined threshold; a 1 bit DAC arranged to output an analog signal proportional to said digital pulse; and a subtractor arranged to subtract said analog signal from the input signal sent to the integrator; wherein the 1-bit DAC comprises an output MOS transistor having a gate, a source and a drain; the gate of the MOS transistor being maintained to a predetermined control voltage and the drain of the MOS transistor being connected by default to a current sink; a control circuit arranged to, in response to an input signal, bring the MOS transistor to a non-conductive state where any drop in voltage of the MOS transistor source causes the MOS transistor to conduct and, after connecting the drain of the MOS transistor away from the current sink and to an output node, pull down the source of the MOS transistor until a predetermined charge is sent to the output node through the MOS transistor.

According to an embodiment of this presentation, the control circuit comprises a capacitor having a first capacitor node controllably connectable to a first voltage supply node and a second capacitor node controllably switchable between a second voltage supply node and the first voltage supply node; the first capacitor node being coupled to the source of the MOS transistor; and a bypass circuit arranged for controllably switching the drain of the MOS transistor between said output node and said current sink node.

According to an embodiment of this presentation, the control circuit is arranged to, in response to said input signal: with the drain of the MOS transistor switched to the current sink node, the first capacitor node connected to the first voltage supply node and the second capacitor node switched to the second voltage supply node, disconnect the first capacitor node from the first voltage supply node; and after a first predetermined time, switch the drain of the output MOS transistor to the output node and switch the second capacitor node to the first voltage supply node; and after a second predetermined time, switch the drain of the output MOS transistor to the current sink node, connect the first capacitor node to the first voltage supply node and switch the second capacitor node to the second voltage supply node.

According to an embodiment of this presentation, the delta sigma modulator comprises a first charge MOS transistor for controllably connecting the first capacitor node to the first voltage supply node.

According to an embodiment of this presentation, the delta sigma modulator comprises a second charge MOS transistor arranged between the second capacitor node and the first voltage supply node and a third charge MOS transistor arranged between the second capacitor node and the second voltage supply node for controllably switching the second capacitor node between the second voltage supply node and the first voltage supply node.

According to an embodiment of this presentation, the delta sigma modulator comprises a first bypass MOS transistor arranged between the current sink node and the drain of the output MOS transistor, and a second bypass MOS transistor arranged between the output node and the drain of the output MOS transistor for controllably switching the drain of the output MOS transistor between the output node and the current sink node.

According to an embodiment of this presentation, the first capacitor node is coupled to the source of the output MOS transistor by an isolation switch; the auto-zeroed charge transfer circuit having a control circuit arranged to, in response to an input signal: with the drain of the output MOS transistor switched to the current sink node, the first capacitor node connected to the first voltage supply node and the second capacitor node switched to the second voltage supply node, disconnect the first capacitor node from the first voltage supply node and turn the isolation switch on; and after a first predetermined time, switch the drain of the output MOS transistor to the output node and switch the second capacitor node to the first voltage supply node; and after a second predetermined time, switch the drain of the output MOS transistor to the current sink node, turn the isolation switch off, connect the first capacitor node to the first voltage supply node and switch the second capacitor node to the second voltage supply node.

According to an embodiment of this presentation, the delta sigma modulator comprises a first charge MOS transistor for controllably connecting the first capacitor node to the first voltage supply node; a second charge MOS transistor arranged between the second capacitor node and the first voltage supply node and a third charge MOS transistor arranged between the second capacitor node and the second voltage supply node for controllably switching the second capacitor node between the second voltage supply node and the first voltage supply node.

An embodiment of this presentation also comprises a method for transferring a precise charge through an output MOS transistor, the method comprising: in response to an input signal, coupling a source of the output MOS transistor to a charged capacitor, a drain of the output MOS transistor being coupled to a current drain node; and after a predetermined time, coupling the drain of the output MOS transistor away from the current drain node and to a current output node; and discharging the capacitor into the current output node through the output MOS transistor. According to an embodiment of this presentation, during said predetermined time there is a current through the MOS transistor to preset the gate-source voltage to a value that is related to the threshold voltage of the transistor, plus any variation in threshold due to flicker noise or RTS noise.

According to an embodiment of this presentation, said coupling a source of the output MOS transistor to a charged capacitor comprises: having a first node of the capacitor, connected to the source of the output MOS transistor, also connected to a first voltage supply node while a second node of the capacitor is connected to a second voltage supply node; and in response to said input signal, disconnecting the first capacitor node from the first voltage supply.

According to an embodiment of this presentation, said discharging the capacitor into the current output node comprises: switching the second node of the capacitor away from the second voltage supply node and to the first voltage supply node.

According to an embodiment of this presentation, said coupling a source of the output MOS transistor to a charged capacitor comprises: having a first node of the capacitor connected to a first voltage supply node while a second node of the capacitor is connected to a second voltage supply node; and in response to said input signal, disconnecting the first capacitor node from the first voltage supply and connecting the first capacitor node to the source of the output MOs transistor.

According to an embodiment of this presentation, said discharging the capacitor into the current output node comprises: switching the second node of the capacitor away from the second voltage supply node and to the first voltage supply node.

A high precision detector subsystem is also disclosed, comprising, a detector that outputs current as a function of detected input, a charge transfer circuit according to an embodiment of this presentation, that generates a precise charge; a counting feedback circuit that can count number of the precise charges that make up the current from the detector output.

Certain embodiments may provide various technical advantages depending on the implementation. For example, a technical advantage of some embodiments may include the capability to provide a precise quantity of charge for a charge generating circuit that overcomes flicker and RTS noise. Other embodiments may provide a precise charge to a detector circuit to use as a base measure to digitize the detector output with high precision.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of this presentation and its advantages, reference is now made to the following description taken in conjunction with the accompanying drawings, in which like reference numerals represent like parts.

DETAILED DESCRIPTION

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

Figure 2:
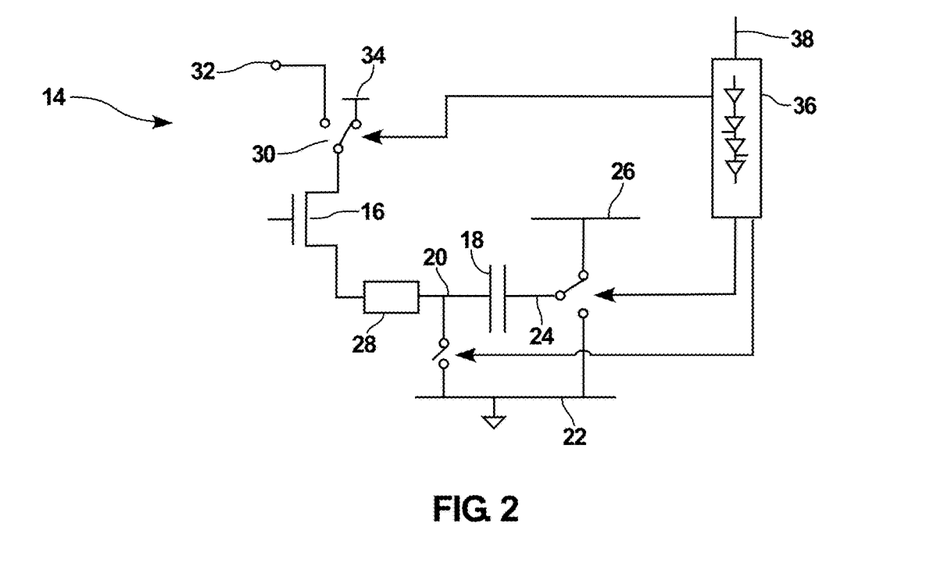
FIG. 2 illustrates an auto zeroed charge transfer circuit according to an embodiment of this presentation.

FIG. 2 illustrates an auto-zeroed charge transfer circuit 14 according to an embodiment of this presentation, the circuit 14 comprising: an output MOS transistor 16 having a gate, a source and a drain; a capacitor 18 having a first capacitor node 20 controllably connectable to a first voltage supply node 22 and a second capacitor node 24 controllably switchable between a second voltage supply node 26 and the first voltage supply node 22. According to an embodiment of this presentation, first capacitor node 20 is coupled 28 to the source of the output MOS transistor 16, and a bypass circuit 30 is arranged for controllably switching the drain of the output MOS transistor 16 between an output node 32 and a current sink node 34.

According to an embodiment of this presentation, circuit 14 comprises a control circuit 36 arranged to: in response to an input signal 38 and starting from a default mode, with the drain of the output MOS transistor 16 switched to the current sink node 34, with the first capacitor node 20 connected to the first voltage supply node 22 and the second capacitor node switched to the second voltage supply node 26 (i.e. with capacitor 18 charged), disconnect the first capacitor node 20 from the first voltage supply node 22. Control circuit 36 is further arranged to then, after a first predetermined time, switch the drain of the output MOS transistor 16 to the output node 32 and switch the second capacitor node 24 to the first voltage supply node 22 (thus causing the capacitor 18 to discharge into output node 32 through transistor 16); and after a second predetermined time (sufficient for the capacitor 18 to fully discharge), switch the drain of the output MOS transistor 16 to the current sink node 34, connect the first capacitor node 20 to the first voltage supply node 22 and switch the second capacitor node to the second voltage supply node. 26 (thus recharging the capacitor 18 and returning to the default mode).

According to an embodiment of this presentation, the first predetermined time is long enough to let the voltage of the source of transistor 16 stabilize after the first capacitor node 20 (coupled to the source of transistor 16) gets disconnected from first voltage supply node 22. According to an embodiment of this presentation, at least some bias current is run through transistor 16 to set the gate-source voltage. This current flows to current sink node 34. The gate of the output MOS transistor 16 is maintained at a higher predetermined voltage all the time. It is noted that the voltage at which the source of transistor 16 stabilizes depends on the (fixed, known) gate voltage as well as on the threshold voltage of transistor 16 (unknown as it varies with flicker and RTS noise). It is noted that the current (of unknown value, depending on the unknown threshold voltage of transistor 16) that flows through transistor 16 while the voltage of the source of transistor 16 stabilizes, during the first predetermined time, is sent to the current sink node 34. According to an embodiment of this presentation, after the first predetermined time has lapsed and after the drain of transistor 16 is switched to output node 32; when the second capacitor node 24 is switched to the first voltage supply node 22: all of the current stored in the capacitor is discharged to output node 32 through transistor 16, with no influence of the threshold voltage of transistor 16 after said predetermined time on the current discharged to output node 32. The inventor has shown that noise-related variations of the threshold voltage of other transistors of circuit 14 (for example in bypass circuit 30) have a negligible influence on the current discharged by circuit 14. According to an embodiment of this presentation, the control circuit 36 can comprise a multi-tap delay line using for example a number of digital buffers connected in series for generating a plurality of adequately timed digital control signals from a digital input signal.

Figure 3:
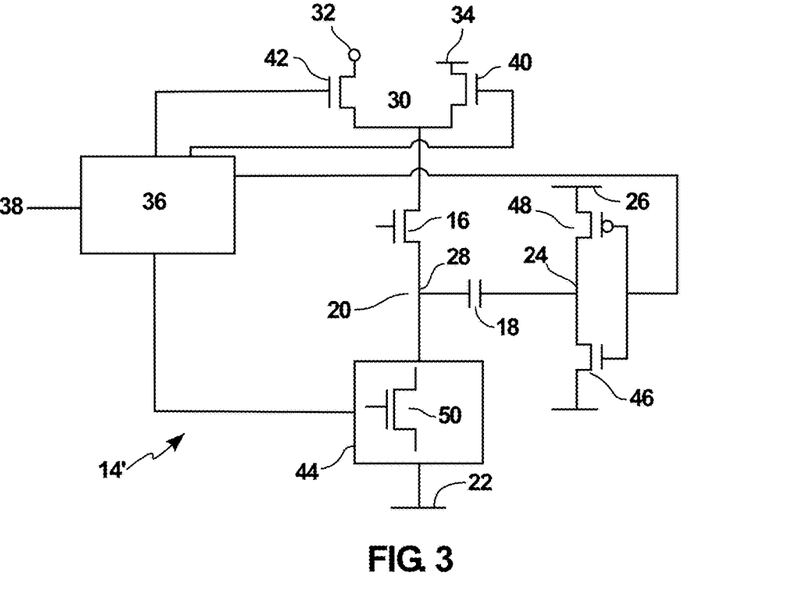
FIG. 3 illustrates an auto zeroed charge transfer circuit according to an embodiment of this presentation.

FIG. 3 illustrates an embodiment 14' of the circuit 14 of FIG. 2, where bypass circuit 30 comprises a first bypass MOS transistor 40 arranged between the current sink node 34 and the drain of transistor 16, and a second bypass MOS transistor 42 arranged between the output node 32 and the drain of transistor 16, for controllably switching the drain of transistor 16 between the output node 32 and the current sink node 34. In the embodiment of FIG. 3, first capacitor node 20 is coupled 28 to the source of transistor 16 by being directly connected to the source of transistor 16 and circuit 14 comprises a pre-biasing circuit 44, for example comprising a first charge MOS transistor 50, for controllably connecting the first capacitor node 20 to the first voltage supply node 22. In the embodiment of FIG. 3, circuit 14 further comprises a second charge MOS transistor 46, arranged between the second capacitor node 24 and the first voltage supply node 22, and a third charge MOS transistor 48, arranged between the second capacitor node 24 and the second voltage supply node 26, for controllably switching the second capacitor node 24 between the second voltage supply node 26 and the first voltage supply node 22.

Figure 4:
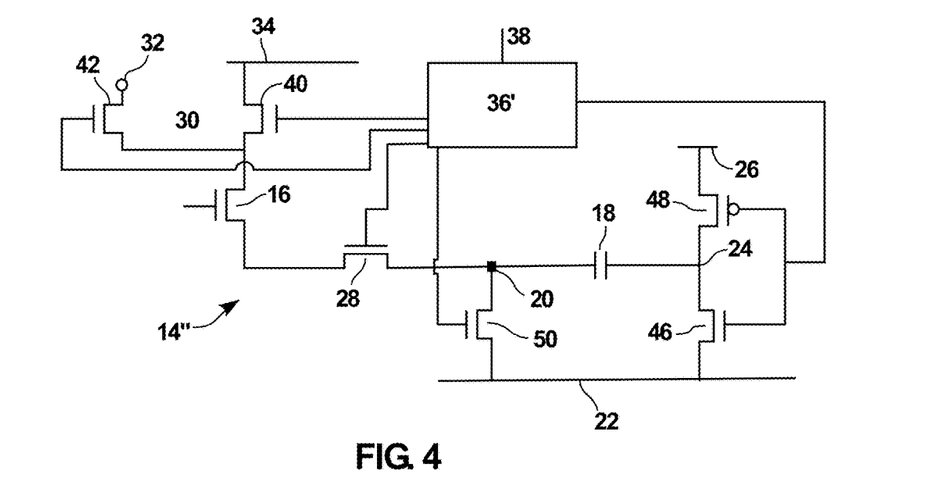
FIG. 4 illustrates an auto zeroed charge transfer circuit according to an embodiment of this presentation.

FIG. 4 illustrates an embodiment 14" of the circuit 14 of FIG. 2, where the first capacitor node 20 is coupled to the source of transistor 16 by an isolation switch 28, for example a MOS transistor. Otherwise, circuit 14" is identical to circuit 14', except that circuit 14" comprises a control circuit 36' arranged to operate as follows: in response to an input signal 38 and from a default mode of circuit 14" (with the drain of transistor 16 switched to the current sink node 34, the isolation switch 28 off, the first capacitor node 20 connected to the first voltage supply node 22 and the second capacitor node 24 switched to the second voltage supply node 26) disconnect the first capacitor node 20 from the first voltage supply node 22 and turn the isolation switch 28 on; and after a first predetermined time, switch the drain of transistor 16 to the output node 32 then switch the second capacitor node 24 to the first voltage supply node; and after a second predetermined time sufficient for discharging the capacitor, return to the default mode by switching the drain of transistor 16 back to the current sink node 34, turn the isolation switch 28 off, connect the first capacitor node 20 to the first voltage supply node 22 and switch the second capacitor node 24 to the second voltage supply node 26.

Consistently with the description of the first predetermined time in relation with FIG. 2, the first predetermined time used by control circuit 36' is long enough to let the voltage of the source of transistor 16 stabilize after it is connected to the first capacitor node 20 through switch 28, after capacitor node 20 gets disconnected from first voltage supply node 22. The voltage at which the source of transistor 16 stabilizes depends on the fixed gate voltage as well as on the unknown threshold voltage of transistor 16. The current that flows through transistor 16 during the first predetermined time is sent to the current sink node 34. Once the first predetermined time has lapsed and the drain of transistor 16 is switched to output node 32, when the second capacitor node 24 is switched to the first voltage supply node 22, all of the current stored in the capacitor is discharged to output node 32 through transistor 16, with no influence of the threshold voltage of transistor 16 before the first predetermined time on the current discharged to output node 32.

Figure 5:
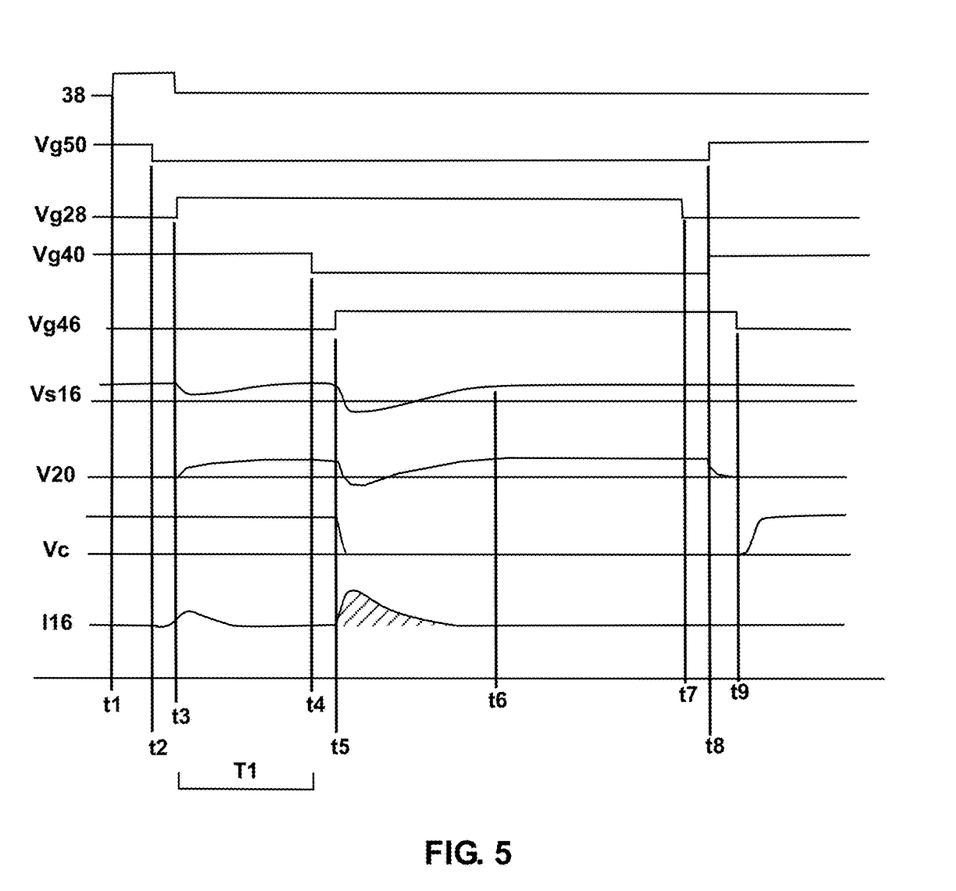
FIG. 5 illustrates an operation of the circuit of FIG. 4.

FIG. 5 illustrates an operation of the circuit 14" of FIG. 4. At a time t1, control circuit 36' receives an input signal 38. In FIG. 5, signal 38 is shown as changing from 0 to 1, but control circuit 36' can be arranged to be triggered by a different input signal 38. Control circuit 36' is arranged such that, when input signal 38 is received, circuit 14" is in a default mode where: the drain of transistor 16 is switched to the current sink node 34 by transistor 40 being on and transistor 42 being off; the isolation transistor 28 is off; the first capacitor node 20 is connected to the first voltage supply node 22 by transistor 50 being on; and the second capacitor node 24 is switched to the second voltage supply node 26 by transistor 48 being on and transistor 46 being off.

In response to signal 38, at a time shown as t2, transistor 50 is turned off by lowering its gate voltage Vg50. At a time shown as t3, transistor 28 is turned on by raising its gate voltage Vg28. Time t2 and t3 can be any time after t1. Preferably t3 takes place after t2 to reduce power consumption. In FIG. 5, t3 takes place after t2, and from time t3 the voltage V20 of first capacitor node 20 begins to rise from 0 to 1, while the voltage Vs16 of the source of transistor 16 briefly falls from its default value before stabilizing at an unknown equilibrium voltage that depends notably on the (fixed) voltage of the gate of transistor 16 and the threshold voltage of transistor 16 (itself being sensitive to flicker and RTS noise).

As illustrated in FIG. 5, a current 116 flows through transistor 16 while the voltage Vs16 of the source of transistor 16 stabilizes. According to an embodiment of this presentation, the current 116 that flows through transistor 16 while the voltage Vs16 of the source of transistor 16 stabilizes after t3 is directed to current sink node 34. This current can be sent back to a power source of the circuit 14".

According to an embodiment of this presentation, at a time t4, a first predetermined time T1 after time t3, transistor 40 is switched off by bringing its gate voltage Vg40 to 0. Transistor 42 can be controlled by the inverse of Vg40, so that turning transistor 40 off turns transistor 42 on. Alternatively, transistor 42 can be turned on after transistor 40 is turned off, and reciprocally. As outlined above, the first predetermined time or duration T1 is long enough to let the voltage Vs16 of the source of transistor 16 stabilize at an (unknown) equilibrium voltage after said source is connected to the first capacitor node 20 through switch 28 (at t3), after capacitor node 20 gets disconnected from first voltage supply node 22 (at t2). At a time shown as t5 (after t4 or eventually simultaneous with t4), transistor 46 is turned on by raising its gate voltage Vg46 to a logic 1 while transistor 48 is turned off at the same time. As illustrated in FIG. 4, transistor 48 can be of opposite conductivity type as transistor 46, and receive a same gate voltage. The turning on of transistor 46 and turning off of transistor 48 pulls second capacitor node 24 to zero, and therefore pulls first capacitor node 20 below zero by the voltage across the charged capacitor 18, before stabilizing back at a time t6 to the unknown equilibrium voltage after capacitor 18 is fully discharged into output node 32 through transistor 16. It is noted that t6 depends on the charge of the capacitor 18 and of the impedance of the circuit capacitor 18 discharges into.

According to an embodiment of this presentation, a second predetermined time or duration T2 after t5, at a time shown as t7 and thereafter (t7 being simultaneous with, or later than, t6), circuit 14" is returned to its default state, for example by turning transistor 28 off (at t7 in FIG. 5), turning transistors 40 and 50 on and turning transistor 42 off (at a time shown as t8 in FIG. 5), then turning transistor 46 off and transistor 48 on (at a time shown as t9 in FIG. 5). The durations of T1 and T2 depend on the MOS technology in which a circuit according to this presentation is implemented. For example, T1 may be in the range of 100 to 300 ps and T2 may be in the range of 100 to 500 ps with a 130 nm CMOS technology.

FIG. 5 also illustrates the voltage Vc between first node 20 and second node 24 of capacitor 18, and the current 116 that flows through transistor 16. According to an embodiment of this presentation, the quantity of current 116 that flows through transistor 16 between t5 and t6 is directed to current output node 32 and it depends precisely on the capacitance of capacitor 18, as well as the voltage of nodes 22 and 26. This quantity of current does not depend on any drift of the threshold voltage of transistor 16 before time t5. At this juncture, it is noted that if the threshold voltage of transistor 16 varies between t5 and t6, the amount of charge transferred by a circuit according to an embodiment of this presentation will vary due to said noise. However, the time between t5 and t6 being small, the chances of the threshold voltage of transistor 16 varying strongly between t5 and t6 are small, whereby a circuit according to an embodiment of this presentation has a low sensitivity to noise. It follows that a circuit according to an embodiment of the present disclosure allows delivering to an output node 32 a well known quantity of charges (current over time) that shows very little sensitivity to flicker and RTS noise.

According to an embodiment of this presentation, second voltage supply node 26 can be maintained at +1.2 volts while second voltage supply node 22 can be maintained at ground. According to an embodiment of this presentation, capacitor 18 can have a capacitance of between 1 to 5 Femto-Farads.

Figure 6:
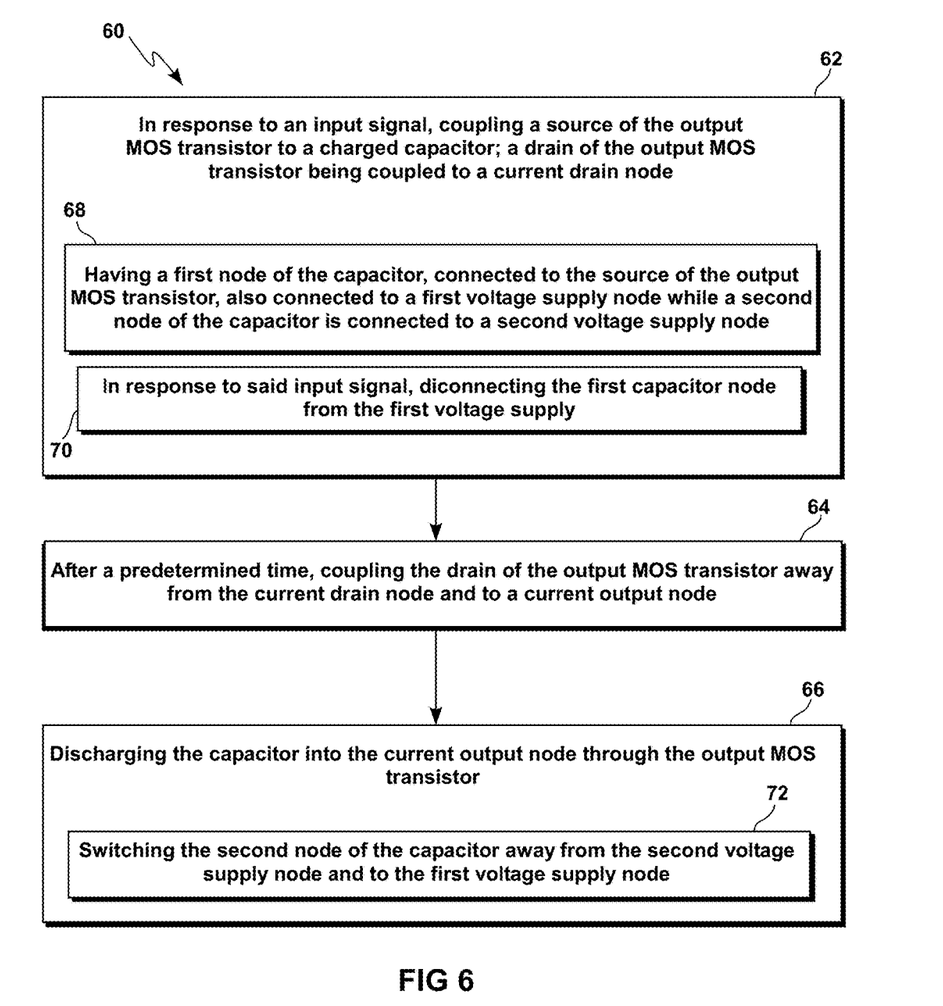
FIG. 6 illustrates a method according to an embodiment of this presentation.

FIG. 6 illustrates a method 60 according to an embodiment of this presentation; the method comprising: in response to an input signal, coupling 62 a source of the output MOS transistor 16 (see FIG. 3 or 4) to a charged capacitor; a drain of the output MOS transistor being coupled, e.g. through 40, to a current drain node; and after a first predetermined time, coupling 64 the drain of the output MOS transistor away from the current drain node and, e.g. through 42, to a current output node; and discharging 66 the capacitor into the current output node through the output MOS transistor.

According to an embodiment of this presentation, said coupling 62a source of the output MOS transistor to a charged capacitor comprises: having a first node of the capacitor, connected to the source of the output MOS transistor, also connected 68 to a first voltage supply node while a second node of the capacitor is connected to a second voltage supply node; and in response to said input signal, disconnecting 70 the first capacitor node from the first voltage supply.

According to an embodiment of this presentation, said discharging 66 the capacitor into the current output node comprises: switching 72 the second node of the capacitor away from the second voltage supply node and to the first voltage supply node.

Figure 7:
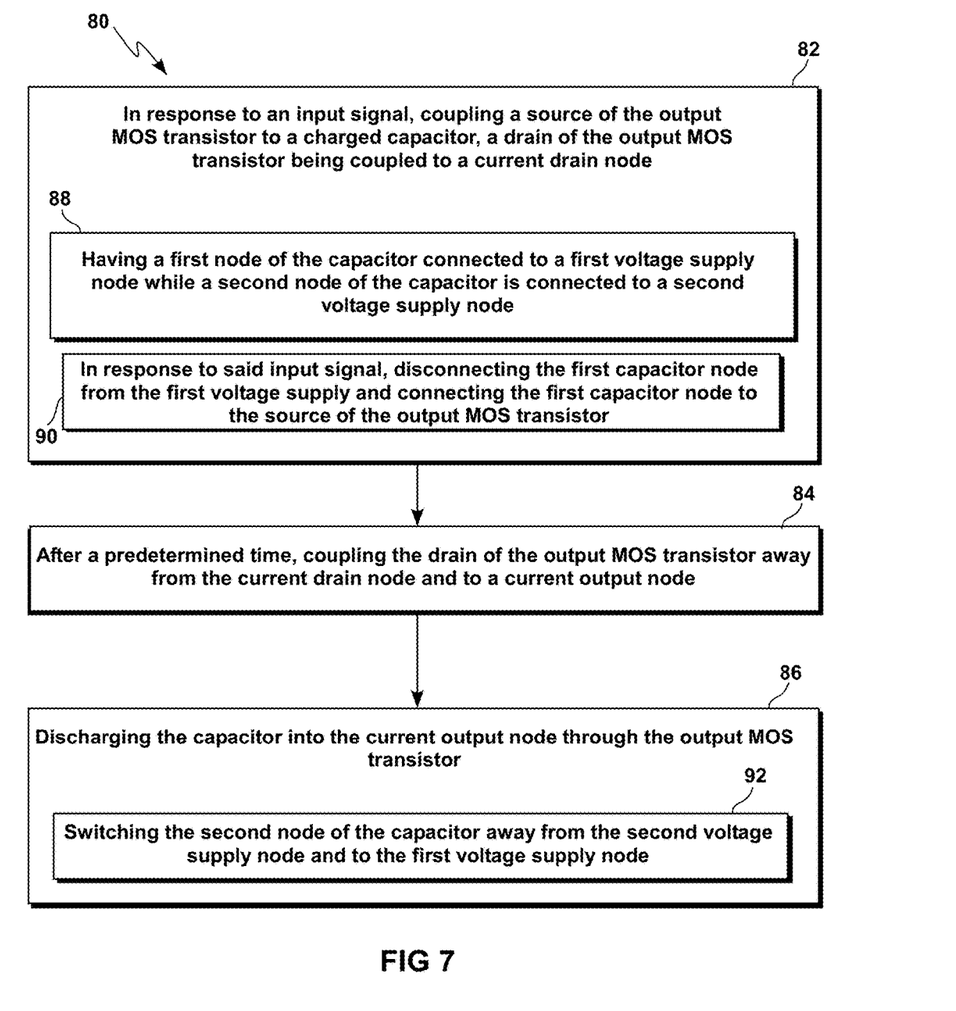
FIG. 7 illustrates a method according to an embodiment of this presentation.

FIG. 7 illustrates a method 80 according to an embodiment of this presentation; the method comprising: in response to an input signal, coupling 82 a source of the output MOS transistor 16 to a charged capacitor; a drain of the output MOS transistor being coupled, e.g. through 40, to a current drain node; and after a first predetermined time, coupling 84 the drain of the output MOS transistor away from the current drain node and, e.g. through 42, to a current output node; and discharging 86 the capacitor into the current output node through the output MOS transistor.

According to an embodiment of this presentation, said coupling 82 a source of the output MOS transistor to a charged capacitor comprises: having 88 a first node of the capacitor connected to a first voltage supply node while a second node of the capacitor is connected to a second voltage supply node; and in response to said input signal, disconnecting 90 the first capacitor node from the first voltage supply.

According to an embodiment of this presentation, said discharging 86 the capacitor into the current output node comprises: switching 92 the second node of the capacitor away from the second voltage supply node and to the first voltage supply node.

Figure 8:
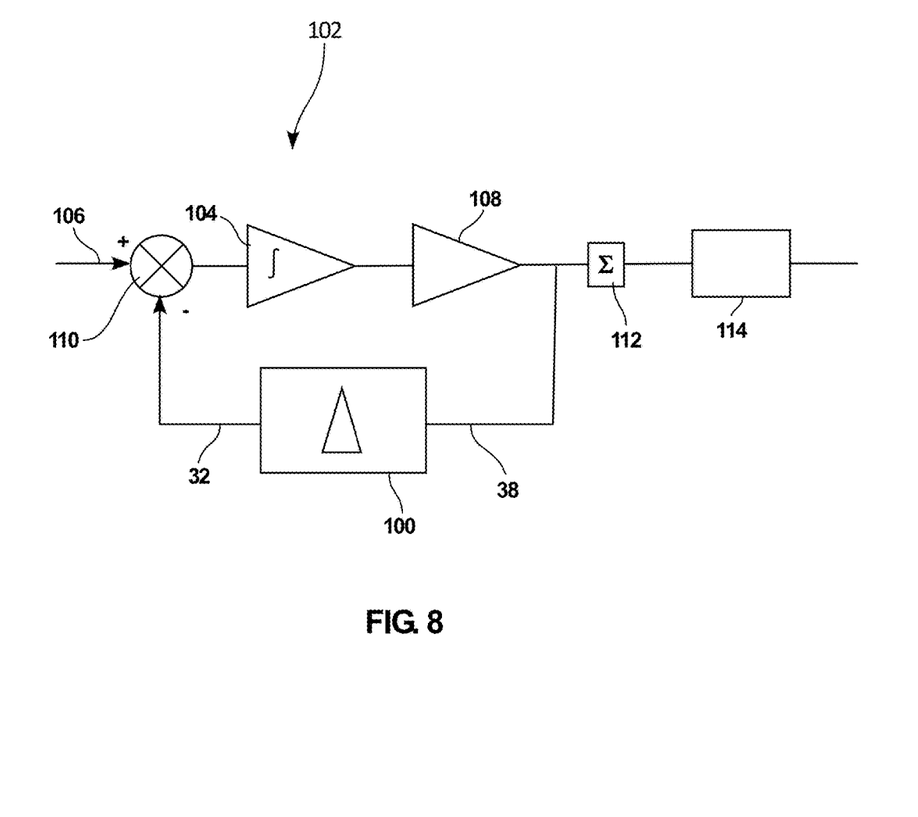
FIG. 8 illustrates an auto zeroed charge transfer circuit according to an embodiment of this presentation used as a 1-bit DAC in a Delta-Sigma modulator.

FIG. 8 illustrates an auto zeroed charge transfer circuit according to an embodiment of this presentation used as a 1-bit DAC 100 in a Delta-Sigma modulator 102 comprising: an integrator 104 arranged to integrate an input signal 106; a comparator or a threshold gate 108 arranged to output a predetermined digital pulse when an output of the integrator goes beyond a predetermined threshold; a 1 bit DAC 100 arranged to output an analog signal proportional to said digital pulse; and a subtractor 110 arranged to subtract said analog signal from the input signal sent to the integrator. A counter 112 can be arranged to count the digital pulses output by threshold gate 108, the value of counter 112 being periodically output by a buffer 114. According to an embodiment of this presentation, the 1-bit DAC 100 can be the auto-zeroed charge transfer circuit 14' illustrated in FIG. 3, and comprise (see FIG. 3) an output MOS transistor 16 having a gate, a source and a drain; the gate of the MOS transistor 16 being maintained to a predetermined control voltage (not shown) and the drain of the MOS transistor 16 being connected by default to a current sink 34. A control circuit (30, 36, 46, 48, 50) is arranged to: a/ in response to an input signal received on an input node 38, bring the MOS transistor 16 to a non-conductive state where any drop in voltage of the source of the MOS transistor 16 causes the MOS transistor 16 to conduct; and b/ after connecting the drain of the MOS transistor 16 away from the current sink 34 and to an output node 32, pull down the source of the MOS transistor 16 until a predetermined charge, stored in a controllably chargeable capacitor 18, is sent to output node 32 through MOS transistor 16.

According to an embodiment of this presentation, the control circuit (30, 36, 46, 48, 50) comprises said controllably chargeable capacitor 18, having a first capacitor node 28 controllably connectable to a first voltage supply node 22 and a second capacitor node 24 controllably switchable between a second voltage supply node 26 and the first voltage supply node 22, the first capacitor node 28 being coupled to the source of the MOS transistor 16; and a bypass circuit 30 arranged for controllably switching the drain of the MOS transistor 16 between said output node 32 and said current sink node 34.

According to an embodiment of this presentation, the control circuit (30, 36, 46, 48, 50) is arranged to, from a default mode where: the drain of the MOS transistor 16 is switched to the current sink node 34, the first capacitor node 28 is connected to the first voltage supply node 22 and the second capacitor node 24 is switched to the second voltage supply node 26; and in response to said input signal on input node 38: disconnect the first capacitor node 28 from the first voltage supply node 22; and after a first predetermined time, switch the drain of the MOS transistor 16 to the output node 32 and switch the second capacitor node 24 to the first voltage supply node 22. Then after a second predetermined time, the control circuit can return to the default mode by switching the drain of the MOS transistor 16 to the current sink node 34, connecting the first capacitor node 28 to the first voltage supply node 22 and switching the second capacitor node 24 to the second voltage supply node 26.

As detailed above, any of for example the charge transfer circuits 14, 14', 14" described in relation with FIGS. 2, 3 and 4 allows outputting a predetermined charge in response to an input signal 38. According to an embodiment of this presentation, a charge transfer circuit, as for example illustrated in FIG. 2, 3 or 4, can be used in a Delta Sigma modulator, as for example illustrated in relation with FIG. 8, as a 1-bit DAC 100 that outputs a predetermined charge in response to an input signal, thus allowing to subtract a predetermined amount of charges (Delta) from the Delta Sigma modulator analog input each time the integral of the input goes over the threshold of threshold gate 108.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set. MOS transistors having given conductivity types have been shown in the drawings, but embodiments of this presentation can as well use MOS transistors of complementary conductivity types where appropriate.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A delta sigma modulator comprising:
    an integrator arranged to integrate an input signal;
    a comparator arranged to output a predetermined digital pulse when an output of the integrator goes beyond a predetermined threshold;
    a 1 bit DAC arranged to output a predetermined analog signal in response to said digital pulse; and
    a subtractor arranged to subtract said analog signal from the input signal sent to the integrator; wherein the 1-bit DAC comprises:
    an output MOS transistor having a gate, a source and a drain; the gate of the MOS transistor being maintained to a predetermined control voltage and the drain of the MOS transistor being connected by default to a current sink;
    a control circuit arranged to, in response to said digital pulse, bring the MOS transistor to a non-conductive state where any drop in voltage of the MOS transistor source causes the MOS transistor to conduct and, after connecting the drain of the MOS transistor away from the current sink and to an output node, pull down the source of the MOS transistor until a predetermined charge is sent to the output node through the MOS transistor.

2. The delta sigma modulator of claim 1, wherein the control circuit comprises:
    a capacitor having a first capacitor node controllably connectable to a first voltage supply node and a second capacitor node controllably switchable between a second voltage supply node and the first voltage supply node; the first capacitor node being coupled to the source of the MOS transistor; and
    a bypass circuit arranged for controllably switching the drain of the MOS transistor between said output node and said current sink node.

3. The delta sigma modulator of claim 2, wherein said control circuit is arranged to, in response to said digital pulse:
    with the drain of the MOS transistor switched to the current sink node, the first capacitor node connected to the first voltage supply node and the second capacitor node switched to the second voltage supply node, disconnect the first capacitor node from the first voltage supply node; and
    after a first predetermined time, switch the drain of the output MOS transistor to the output node and switch the second capacitor node to the first voltage supply node; and
    after a second predetermined time, switch the drain of the output MOS transistor to the current sink node, connect the first capacitor node to the first voltage supply node and switch the second capacitor node to the second voltage supply node.

4. The delta sigma modulator of claim 2 comprising a first charge MOS transistor for controllably connecting the first capacitor node to the first voltage supply node.

5. The delta sigma modulator of claim 4, comprising a second charge MOS transistor arranged between the second capacitor node and the first voltage supply node and a third charge MOS transistor arranged between the second capacitor node and the second voltage supply node for controllably switching the second capacitor node between the second voltage supply node and the first voltage supply node.

6. The delta sigma modulator of claim 2, comprising a first bypass MOS transistor arranged between the current sink node and the drain of the output MOS transistor, and a second bypass MOS transistor arranged between the output node and the drain of the output MOS transistor for controllably switching the drain of the output MOS transistor between the output node and the current sink node.

7. The delta sigma modulator of claim 6, comprising a first charge MOS transistor for controllably connecting the first capacitor node to the first voltage supply node; a second charge MOS transistor arranged between the second capacitor node and the first voltage supply node and a third charge MOS transistor arranged between the second capacitor node and the second voltage supply node for controllably switching the second capacitor node between the second voltage supply node and the first voltage supply node.

8. The delta sigma modulator of claim 2, wherein the first capacitor node is coupled to the source of the output MOS transistor by an isolation switch; the control circuit arranged to, in response to said digital pulse:
- with the drain of the output MOS transistor switched to the current sink node, the first capacitor node connected to the first voltage supply node and the second capacitor node switched to the second voltage supply node, disconnect the first capacitor node from the first voltage supply node and turn the isolation switch on; and
- after a first predetermined time, switch the drain of the output MOS transistor to the output node and switch the second capacitor node to the first voltage supply node; and
- after a second predetermined time, switch the drain of the output MOS transistor to the current sink node, turn the isolation switch off, connect the first capacitor node to the first voltage supply node and switch the second capacitor node to the second voltage supply node.

\* \* \* \* \*